(12) United States Patent
Sato

(10) Patent No.: US 7,770,094 B2
(45) Date of Patent: Aug. 3, 2010

(54) APPARATUS AND METHOD FOR SOFT DECISION VITERBI DECODING

(75) Inventor: Takahiro Sato, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 396 days.

(21) Appl. No.: 11/844,233

(22) Filed: Aug. 23, 2007

(65) Prior Publication Data

US 2008/0052607 A1  Feb. 28, 2008

(30) Foreign Application Priority Data

Aug. 24, 2006  (JP) .............................. 2006-228098

(51) Int. Cl.
*H03M 13/03* (2006.01)
(52) U.S. Cl. ...................... 714/795; 714/794; 714/796; 365/262; 365/341
(58) Field of Classification Search ......... 714/794–796; 375/341, 262
See application file for complete search history.

(56) References Cited

U.S. PATENT DOCUMENTS

| | | | | |
|---|---|---|---|---|
| 5,841,819 A * | 11/1998 | Hu et al. | ...................... | 375/341 |
| 5,844,946 A * | 12/1998 | Nagayasu | ..................... | 375/341 |
| 5,881,581 A * | 3/1999 | Vinas | ............................ | 68/177 |
| 5,914,988 A * | 6/1999 | Hu et al. | ...................... | 375/341 |
| 6,603,722 B1 * | 8/2003 | Taguchi et al. | ............ | 369/59.21 |
| 6,625,225 B1 * | 9/2003 | Fukuda | ........................ | 375/265 |
| 6,748,034 B2 * | 6/2004 | Hattori et al. | ................ | 375/341 |
| 6,999,521 B1 * | 2/2006 | Azadet et al. | ................ | 375/262 |
| 7,046,747 B2 * | 5/2006 | Vasquez | ...................... | 375/341 |
| 7,289,569 B2 * | 10/2007 | Markman | .................... | 375/265 |
| 7,380,199 B2 * | 5/2008 | Haratsch | ...................... | 714/796 |

FOREIGN PATENT DOCUMENTS

| JP | 2003-249860 A | 9/2003 |
|---|---|---|
| JP | 2006-86761 A | 3/2006 |

OTHER PUBLICATIONS

Forney, G. D, Jr, "The Viterbi Algorithm", proceedings of IEEE, vol. 61, issue 3, pp. 268 - 278, Mar. 1973.
Hiroyuki Yashima, Torikeppusu, " The convolution code and the Viterbi decoding". September.

* cited by examiner

*Primary Examiner*—Esaw T Abraham
(74) *Attorney, Agent, or Firm*—Sughrue Mion, PLLC

(57) ABSTRACT

When a convolution code is decoded, electric power consumption is suppressed keeping error correction capability. In a Viterbi decoder which decodes received signal, a convolution code, having plural series with a soft decision Viterbi decoding method, an estimation control unit estimates quality of the received signal and outputs a control signal according to the quality to a branch metric calculation data obtaining unit. The branch metric calculation data obtaining unit performs logical combination operation between digital multi-value data expressing amplitude of the received signal and the control signal, and thereby, outputs the digital multi-value data directly to a decoding execution unit if the quality of the received signal is lower than a prescribed level, and outputs the digital multi-value data reduced by series each as branch metric calculation data to the decoding execution unit if the quality of the received signal is no less than the prescribed level.

14 Claims, 11 Drawing Sheets

FIG. 7
| CONTROL SIGNAL M | INPUT (IN2, IN1, IN0) | OUTPUT (OUT2, OUT1, OUT0) |
|---|---|---|
| 0 | (IN2, IN1, IN0) | (IN2, IN1, IN0) |
| 1 | | (0, 0, 0) |
FIG. 8
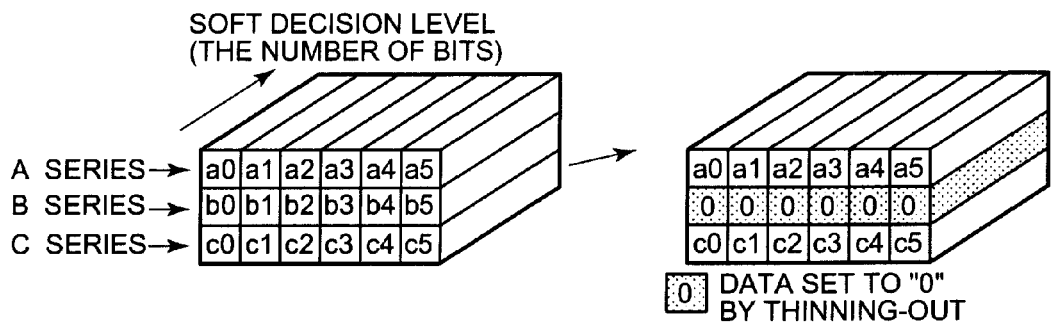
FIG. 9
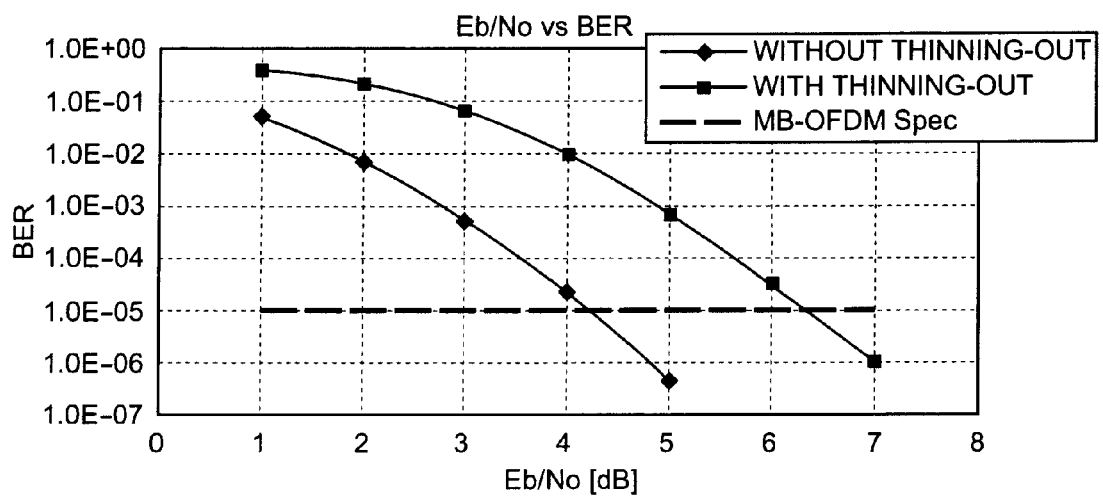

| CONTROL SIGNAL M | INPUT (IN2, IN1, IN0) | OUTPUT (OUT2, OUT1, OUT0) |
|---|---|---|
| 1 | (IN2, IN1, IN0) | (IN2, IN1, IN0) |
| 0 | | (0, 0, 0) |

150

| SHIFT INDICATION (Q1, Q0) | INPUT (IN2, IN1, IN0) | OUTPUT (OUT2, OUT1, OUT0) |
|---|---|---|
| (0, 0) | (IN2, IN1, IN0) | (IN2, IN1, IN0) |
| (0, 1) |  | (0, IN2, IN1) |
| (1, 0) |  | (0, 0, IN2) |

APPARATUS AND METHOD FOR SOFT DECISION VITERBI DECODING

BACKGROUND OF THE INVENTION

1. Field of the Invention

The present invention relates to a decoding technology, and more specifically, to a technology which decodes a signal coded by using a convolution code.

2. Description of the Related Art

A convolution code is frequently used as an error correction code in a field of the digital communication. FIG. 15 illustrates an example of a convolution encoder 300 which is usually used. The convolution encoder 300 obtains the convolution code of constraint length 7 and encoding rate 1/3, and is configured with plural adders 310 and plural delay elements 320 (D flip-flop illustrated as D in FIG. 15). Data line to be transmitted Input D is encoded by the convolution encoder 300 to three series of output signals Output A, Output B, and Output C. Meanwhile, while the convolution encoder 300 encodes Input D to three series of output signals, another configuration of convolution encoder may have other number than three as the number of series of output signals.

FIG. 16 illustrates aspects of the data line to be transmitted Input D and the output signals Output A, Output B, and Output C. The convolution encoder 300 outputs output of three bits (e.g. a0, b0, and c0) for input of one bit (e.g. d0).

In a communication system using the convolution code, a transmission side converts data line to be transmitted to the convolution code with an encoder, and modulates the code sequence obtained by the conversion to transmit it as modulated signal to a transmission line. A receiving side demodulates the modulated signal received from the transmission line to return it to the code sequence such as Output A, Output B, and Output C illustrated in FIG. 16, then further executes decoding processing. The Viterbi algorithm is well known as one of such decoding processing algorithms (non-Patent Document 1 ("The Viterbi Algorithm", Forney, G. D, Jr. proceedings of IEEE, vol. 61, issue 3, pp 268-278) and non-Patent Document 2 ("The convolution code and the Viterbi decoding", Hiroyuki Yashima, Torikeppusu)). The Viterbi algorithm compares the received code sequence with all the code sequence which may have been generated by the encoder of the transmission side (hereinafter, expected code sequence), selects the expected code sequence which is most close to the received code sequence, and decodes it to regenerate original information series.

The Viterbi decoding realizes the decoding with three processing, processing for obtaining difference (branch metric) between the received code sequence and the expected code sequence, processing for repeating ACS (Add Compare Select), and trace back processing for finally decoding data. Generally, a method for obtaining the branch metric with Hamming distance is referred to as a hard decision method, and a method for obtaining the branch metric with Euclid distance is referred to as a soft decision method. While it is an advantage that electric power consumption is small because amount of calculation of the hard decision method is less than that of the soft decision method, the capability of error correction is lower than that of the soft decision method. Thus, a receiver using the soft decision method whose capability of error correction is high is usually adopted in consideration of performance-improvement of the receiver.

In recent years, the high throughput and the high capability of error correction with the small electric power for transmission are required in UWB method (Ultra Wide Band) communication method adopting MB-OFDM (Multi Band-Orthogonal Frequency Division Multiplex) method which is estimated to become widely used as PAN (Personal Area Network). And, this communication method is estimated to be implemented for a mobile terminal, so that high capability of error correction and also suppression of the electric power consumption are required.

By the way, as described above, because the amount of calculation of a receiver of the soft decision method is large, the electric power consumption is also consequently large. While the amount of calculation of a receiver of the hard decision method is relatively small, the capability of error correction is also relatively low.

Various approaches have been performed in order to resolve such dilemma.

Patent Document 1 (Japanese Patent Laid-Open No. 2003-249860) discloses the technology which suppresses the electric power consumption using the soft decision method. FIG. 17 illustrates a conceptual diagram of such technology. When the convolution code is decoded, the received signals such as three series of Output A, Output B, and Output C illustrated in FIG. 16 are converted to three series of data having the width in bit corresponding to the number of bits of the soft decision level as illustrated at the left side of FIG. 17. This data is digital multi-value data which expresses amplitude of the received signal. When the branch metric is obtained using this digital multi-value data, the technology of Patent Document 1 changes bits of the digital multi-value data according to the amplitude of the received signal, then obtains the branch metric. The change of bits is specifically performed by shifting downward each series of bit line forming the digital multi-value data by n bits corresponding to the amplitude, and fixing the upper n bits to "0" so that the effective width in bit after bit-shifting is smaller as the amplitude is larger. Thereby, because the digital multi-value data illustrated at the left side of FIG. 17 is converted to the data illustrated at the right side of FIG. 17, it is possible to reduce the amount of calculation for calculating the branch metric and suppress the electric power consumption when the amplitude is large.

Patent Document 2 (Japanese Patent Laid-Open No. 2006-086761) discloses the technology for selectively using the hard decision method and the soft decision method according to the quality of the received signal. In this technology, the hard decision method is used for the decoding when the quality of the received signal is good, and the soft decision method is used for the decoding when the quality of the received signal is not good. Thereby, when the quality of the received signal is good, it is possible to reduce the amount of calculation, and decrease the electric power consumption.

However, the Patent Document 2 does not specifically disclose the estimation method of the quality of the received signal.

And, in the technology of the Patent Document 1, the receiving condition is good when the amplitude of the received signal is large, and the receiving condition is bad when the amplitude of the received signal is small, so that the amplitude is used as an indicator of the receiving condition of the received signal. It may not be necessarily appropriate that the receiving condition is equally determined according to the size of the variable amplitude of the received signal regardless of the superiority or the inferiority of the transmission line quality or the channel quality.

And, because the technology of the Patent Document 1 narrows the width in bit to reduce the amount of calculation by shifting the bit line for each series of the digital multi-value data, it is necessary to add a circuit for shifting the bit line. Because the shifting circuit also consumes the electric power, the suppression effect of the electric power consumption which is obtained by reducing the amount of calculation is smaller.

Further, because the technology of the Patent Document 2 needs to provide two different methods of decoders, the implementation area is large. It is disadvantage particularly for a mobile terminal.

SUMMARY

An aspect of the present invention is the soft decision Viterbi decoding apparatus for a received signal having plural series of convolution codes. This soft decision Viterbi decoding apparatus has a quality estimation unit, a control signal output unit, and a branch metric calculation data obtaining unit. The quality estimation unit estimates a quality of the received signal and produces an estimated result. The control signal output unit produces an indication when the estimated result rises to a prescribed level. The branch metric calculation data obtaining unit generates data for calculating branch metric in response to the received signal, the data being obtained by thinning-out operation on the received signal in unit of a series of convolution codes when the indication is produced.

Another aspect of the present invention is a decoding apparatus decoding a received signal. This apparatus has a quality estimation unit, a control signal output unit, and a decoding execution unit. The quality estimation unit calculates standard deviation of amplitude of the received signal, and estimates a quality of the received signal based on the standard deviation. The control signal output unit produces an indication in response to the quality. The decoding execution unit executes decoding the received signal in one of a plurality of decoding processes according to the indication.

Meanwhile, an apparatus and a system in which the above methods are implemented are also effective as aspects of the present invention.

According to the decoding technology of the present invention, when the received signal encoded by the convolution code is decoded, it is possible to suppress the electric power consumption keeping the error correction capability, or to suppress the electric power consumption without increasing the implementation area.

BRIEF DESCRIPTION OF THE DRAWINGS

FIG. 7 is a diagram for describing operation of the branch metric calculation data obtaining unit illustrated in FIG. 6 (No. 1);

FIG. 8 is a diagram for describing operation of the branch metric calculation data obtaining unit illustrated in FIG. 6 (No. 2);

FIG. 9 is a diagram for describing BER characteristics of the Viterbi decoder illustrated in FIG. 1;

DETAILED DESCRIPTION OF THE PREFERRED EMBODIMENTS

Figure 1:
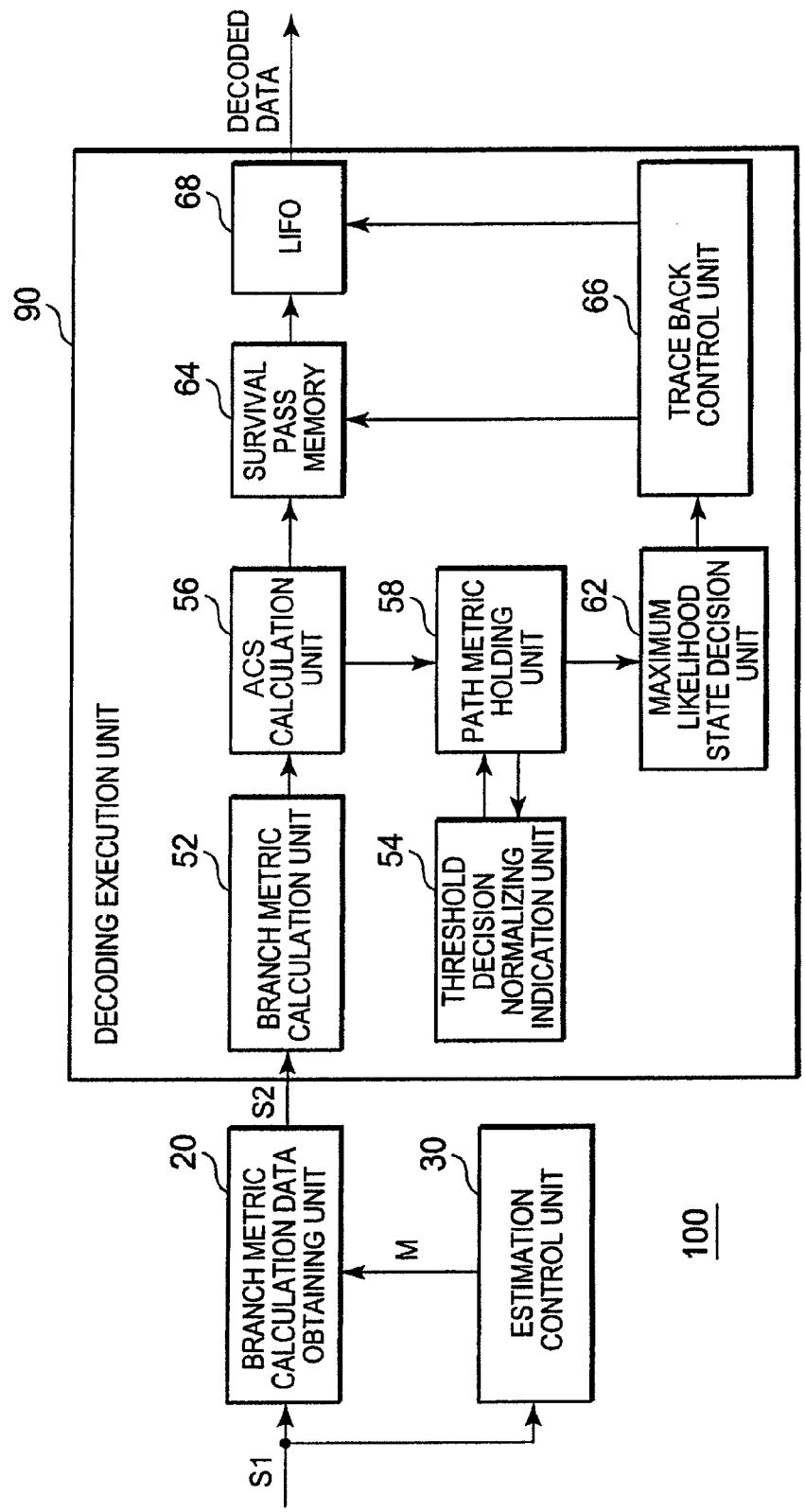
FIG. 1 is a block diagram illustrating a configuration of the Viterbi decoder according to an exemplary embodiment of the present invention.
Figure 16:
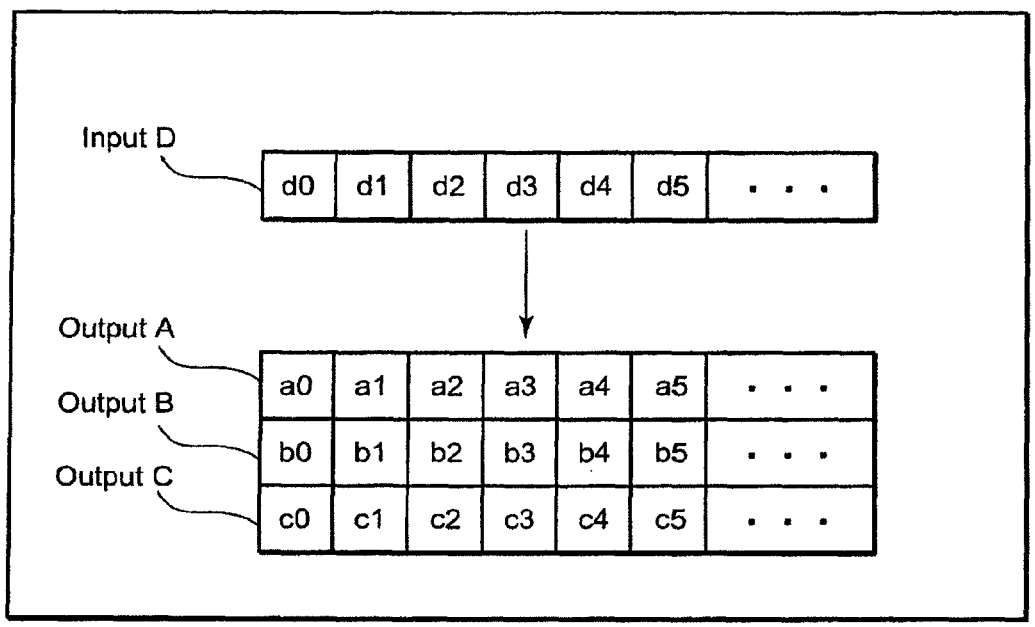
FIG. 16 is a diagram illustrating an aspect of input data and output data of the convolution encoder illustrated in FIG. 15.
Figure 17:
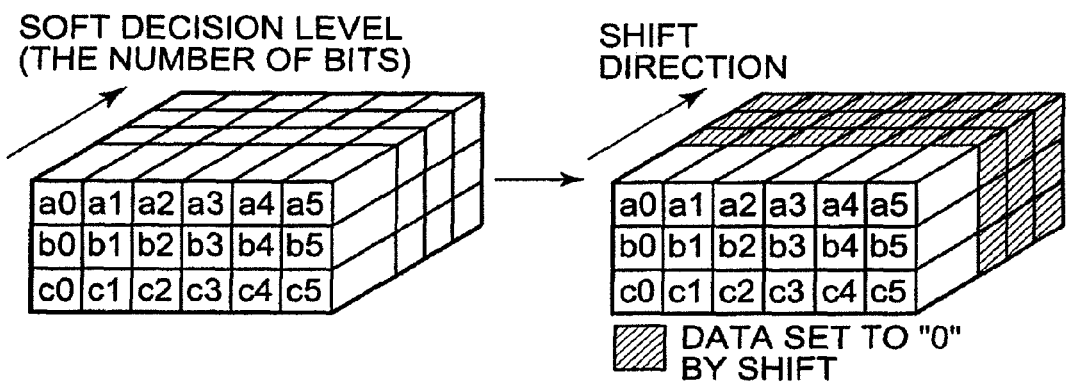
FIG. 17 is a diagram illustrating the processing of bit-shift by the conventional technology.

FIG. 1 illustrates a configuration of a Viterbi decoder 100 according to an exemplary embodiment of the present invention. The Viterbi decoder 100 is the Viterbi decoder of a soft decision method, and includes a branch metric calculation data obtaining unit 20 which obtains data for calculating branch metric by using digital multi-value data S1 expressing the amplitude of the received signal, an estimation control unit 30 which estimates the quality of the received signal using the digital multi-value data S, generates control signal M based on the estimation result, and provides it to the branch metric calculation data obtaining unit 20, and a decoding execution unit 90 which obtains decoded data by decoding the received signal using branch metric calculation data S2 which is obtained by the branch metric calculation data obtaining unit 20. The decoding execution unit 90 includes a branch metric calculation unit 52, a threshold decision normalization indication unit 54, an ACS calculation unit 56, a path metric holding unit 58, a maximum likelihood state decision unit 62, a survival pass memory 64, a trace back control unit 66, and a Last In First Out Memory (LIFO) 68. The digital multi-value data S1 is obtained by digital-converting after decoding modulated signal of transmitted data line coded by the convolution code. Meanwhile, one example is that the digital multi-value data S1 is obtained by converting the received signal having three series (Output A, Output B, and Output C) as illustrated in FIG. 16, and has three series of A series, B series, and C series as illustrated in the left part of FIG. 8, and each series has the width in bit, for example, three bits corresponding to the soft decision level.

Figure 2:
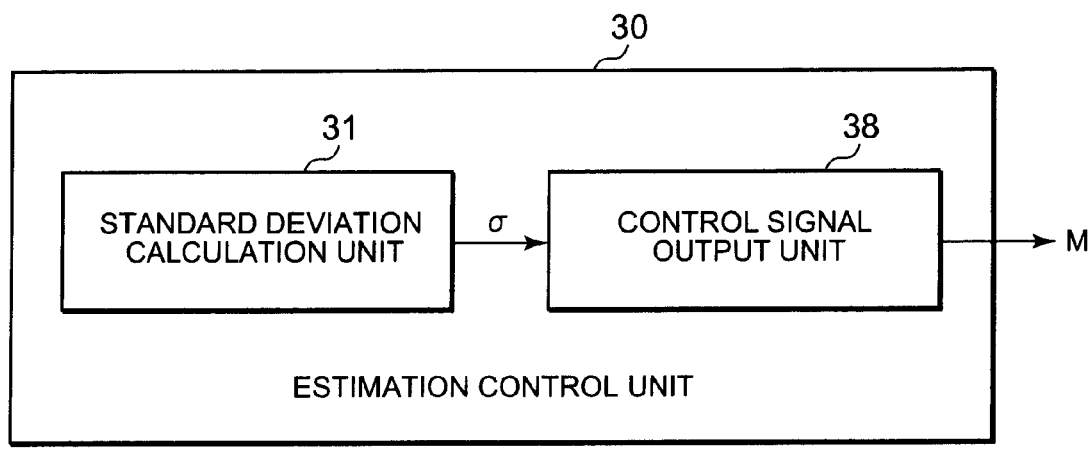
FIG. 2 is a block diagram illustrating a configuration of an estimation control unit of the Viterbi decoder illustrated in FIG. 1.

FIG. 2 illustrates a configuration of the estimation control unit 30. The estimation control unit 30 includes a standard deviation calculation unit 31 which calculates standard deviation σ of the received signal by using the digital multi-value data S1, and a control signal output unit 38 which generates the control signal M according to the standard deviation σ calculated by the standard deviation calculation unit 31, and outputs it to the branch metric calculation data obtaining unit 20.

The quality of the received signal can be expressed with ratio of signal per bit and noise (Eb/No, Eb: Energy per bit, No: Spectral Noise Density). The quality of the received signal is better as this Eb/No is larger. Meanwhile, while the term "quality of a received signal" is equally used in the description according to the present invention, this term should be understood as a comprehensive technical term which includes transmission line quality or channel quality. That is, because the received signal is such a direct target that quality can be decided in the viewpoint of an apparatus decoding the received signal, "quality of a received signal" is an intuitive term. On the other hand, because original good-quality signal is degraded in quality due to environmental factors such as band limit of transmission line or circuit, noise, and disturbance, "transmission line quality" or "channel quality" is more appropriate term in the viewpoint of an apparatus coding signal to be transmitted.

Figure 3:
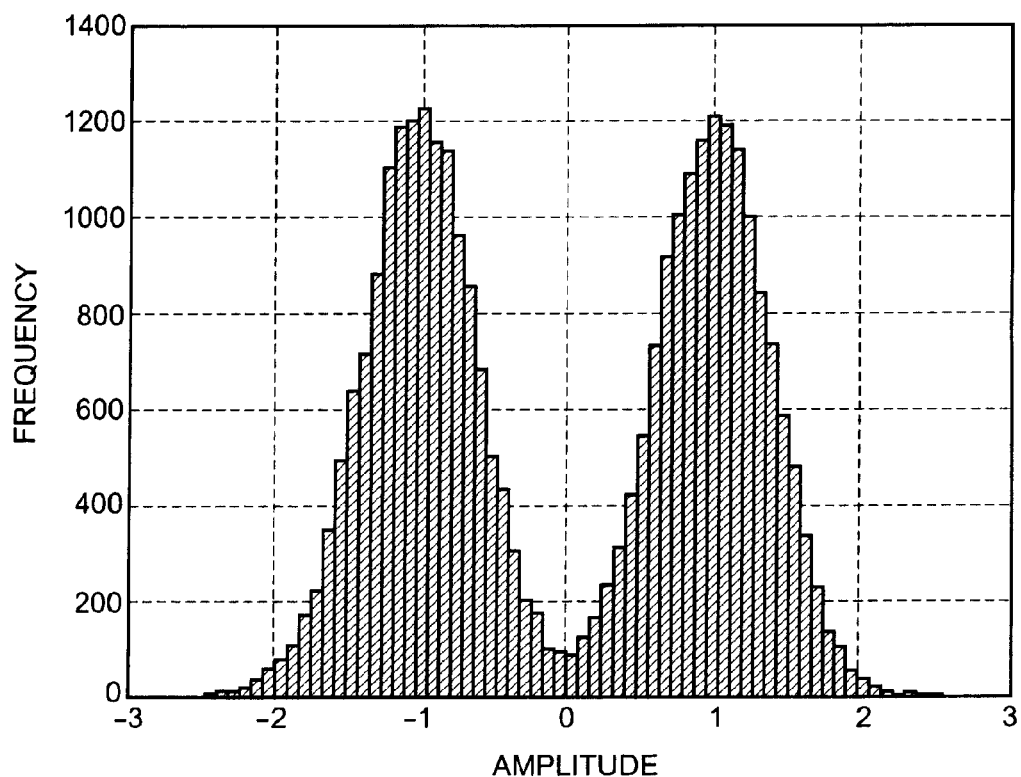
FIG. 3 is a histogram of the amplitude of received signal.
Figure 4:
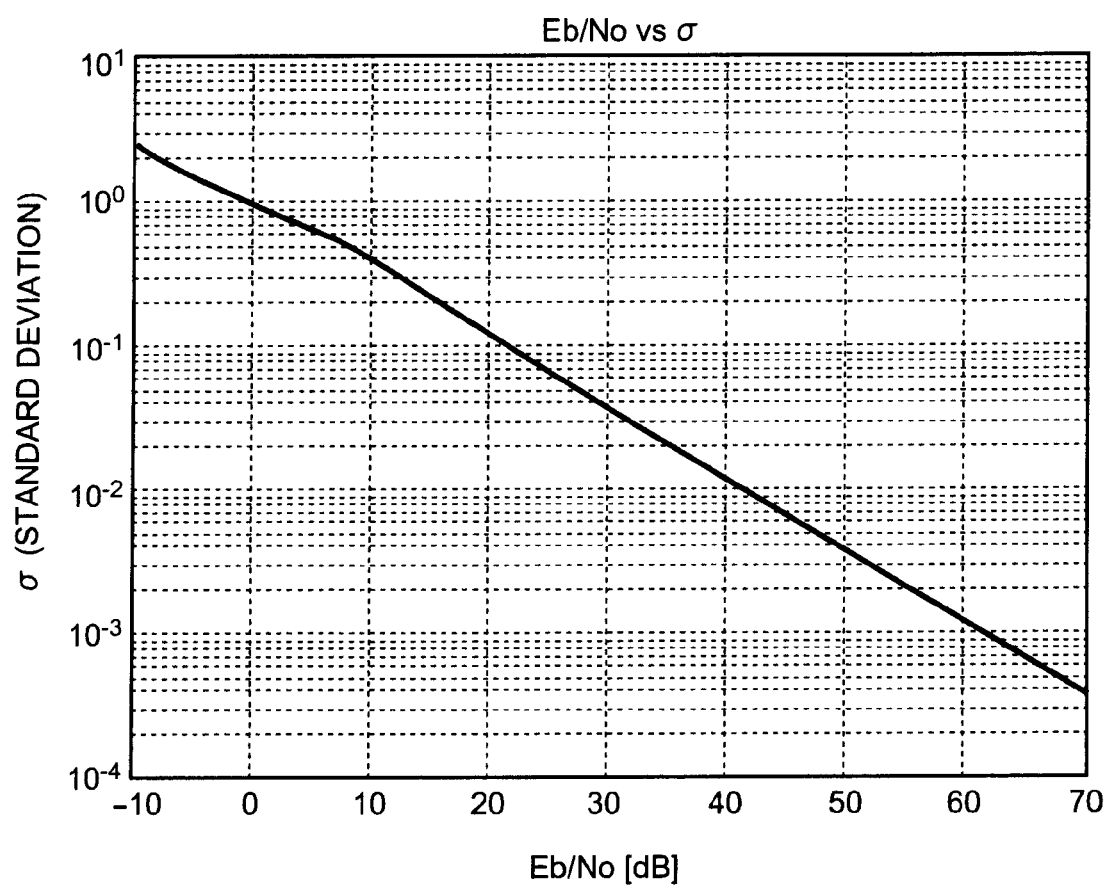
FIG. 4 is a diagram illustrating the relation between standard deviation of the amplitude of received signal and Eb/No.

Generally, the received signal encoded by the convolution code (after demodulation) corresponds to a histogram illustrated in FIG. 3. The relation illustrated in FIG. 4 can be obtained by calculating the standard deviation σ of the amplitude of such received signal to compare it with Eb/No. As understood from FIG. 4, as the standard deviation σ of the amplitude of the received signal is larger, Eb/No is smaller, that is, the quality of the received signal is bad.

In the Viterbi decoder 100 of the exemplary embodiment, the quality of the received signal is estimated by using the standard deviation σ of the received signal in consideration of such relation. In this case, the standard deviation calculation unit 31 of the Viterbi decoder 100 functions as a quality estimation unit.

Figure 5:
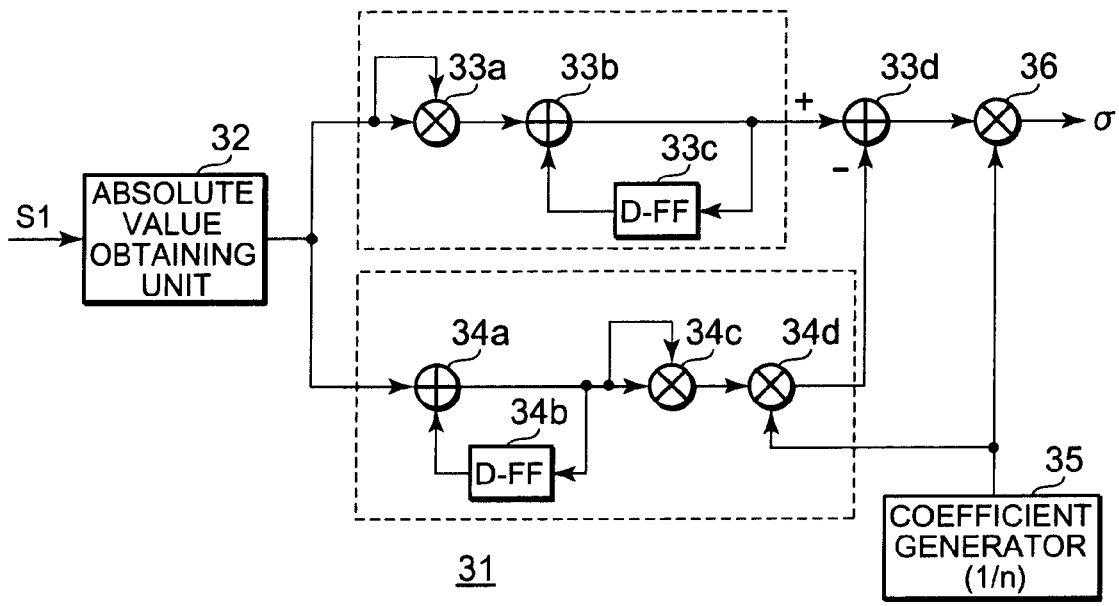
FIG. 5 is a block diagram illustrating a configuration of a standard deviation calculation unit in the estimation control unit illustrated in FIG. 2.

The standard deviation σ of the received signal can be expressed in the following expression (1).

$$\sigma = \sqrt{\frac{1}{n}\sum_{k=1}^{n}\left\{x_k - \frac{\sum_{k=1}^{n}x_k}{n}\right\}^2} \quad (1)$$

σ: standard deviation
$X_K$: absolute value of amplitude
n: the number of samples used for quality estimation The standard deviation σ can be expressed in the following expression (2) by modifying the expression (1).

$$\sigma = \sqrt{\frac{1}{n}\left\{\sum_{k=1}^{n}(x_k)^2 - \frac{\left(\sum_{k=1}^{n}x_k\right)^2}{n}\right\}} \quad (2)$$

σ: standard deviation
$X_K$: absolute value of amplitude
N: the number of samples used for quality estimation The standard deviation calculation unit 31 obtains the standard deviation σ based on the above expression (2), and FIG. 5 illustrates the configuration.

As illustrated in FIG. 5, the standard deviation calculation unit 31 includes an absolute value obtaining unit 32 which obtains absolute value for the digital multi-value data S1, a circuit which calculates the left part in parentheses of the right side of the expression (2) (a circuit surrounded by dotted line in the upper part of FIG. 5, which includes a multiplier 33A, an adder 33B, and a delay element D-FF 33C. Hereinafter, referred to as the first circuit), a circuit which calculates the right part in parentheses of the right side of the expression (2) (a circuit surrounded by dotted line in the lower part of FIG. 5, which includes an adder 34A, a delay element D-FF 34B, a multiplier 34C, and a multiplier 34D. Hereinafter, referred to as the second circuit), a subtracter 33D which subtracts output of the second circuit from output of the first circuit, a coefficient generator 35 which provides a coefficient (1/n) (n: the number of samples) supplied to the second circuit and a multiplier 36 described below, the multiplier 36 which obtains the standard deviation σ by multiplying output of the subtracter 33D by the coefficient from the coefficient generator 35.

The standard deviation calculation unit 31 outputs the standard deviation σ obtained as above to the control signal output unit 38.

The control signal output unit 38 compares a prescribed threshold with the standard deviation σ outputted from the standard deviation calculation unit 31, generates the control signal M according to the comparison result, and outputs it to the branch metric calculation data obtaining unit 20. Specifically, if the standard deviation σ is larger than the threshold, that is, the quality of the received signal is not good, the control signal M is outputted which directly outputs the digital multi-value data S1 as the branch metric calculation data S2 without reducing, on the other hand, If the standard deviation σ is no more than the threshold, that is, the quality of the received signal is good, the control signal M is outputted which reduces a prescribed series of three series of the digital multi-value data S1.

Before the details of the control signal M is described, a configuration of the branch metric calculation data obtaining unit 20 will be described.

Figure 6:
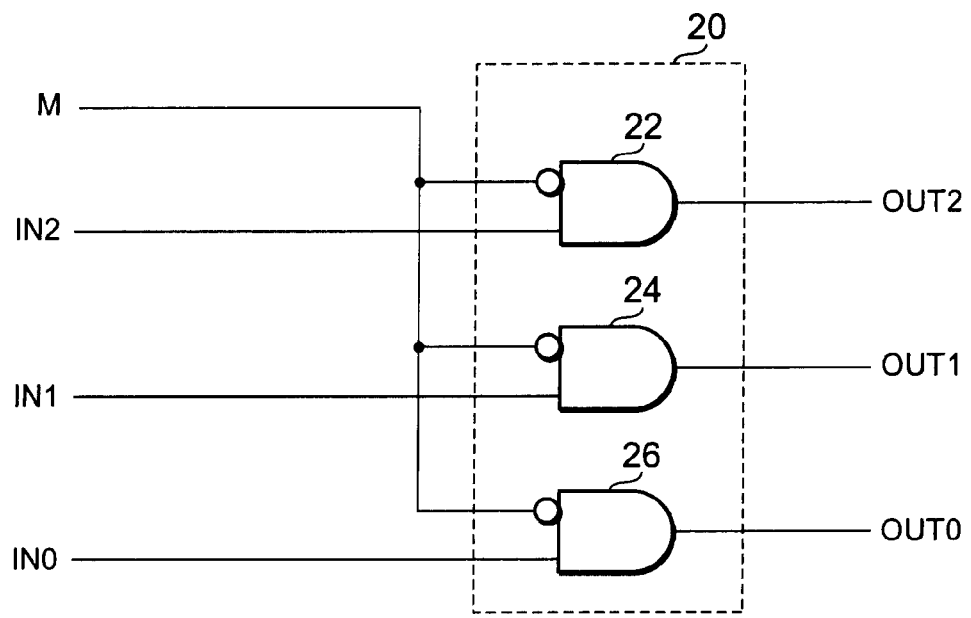
FIG. 6 is a block diagram illustrating a configuration of a branch metric calculation data obtaining unit in the Viterbi decoder illustrated in FIG. 1.

FIG. 6 illustrates the branch metric calculation data obtaining unit 20. In the Viterbi decoder 100 of the exemplary embodiment, for example, the digital multi-value data S1 is inputted to the branch metric calculation data obtaining unit 20 in parallel transmission of three bits each per series corresponding to the width in bit of each series.

As illustrated in FIG. 6, the branch metric calculation data obtaining unit 20 includes a logical AND gate 22, a logical AND gate 24, and a logical AND gate 26. Each of inputs IN 2, IN 1, and IN 0 is logical AND-operated with the control signal M by the branch metric calculation data obtaining unit 20, and is outputted as OUT 2, OUT 1, and OUT 0 respectively.

FIG. 7 illustrates operation of the branch metric calculation data obtaining unit 20. As illustrated in FIG. 7, when the control signal M is "0", data inputted to the branch metric calculation data obtaining unit 20 is directly outputted. On the other hand, when the control signal M is "1", data inputted to the branch metric calculation data obtaining unit 20 is set to "0" and is outputted.

If the standard deviation σ is larger than the threshold, that is, the quality of the received signal is not good, the control signal output unit 38 sets the control signal 0 to directly output the digital multi-value data S1 as the branch metric calculation data S2 without thinning-out. On the other hand, if the standard deviation σ is no more than the threshold, that is, the quality of the received signal is good, the control signal output unit 38 outputs mask signals of signal "0" for data of A series and C series, and signal "1" for data of B series to the branch metric calculation data obtaining unit 20 so as to reduce a prescribed series, for example, B series of three series of the digital multi-value data S1. Thereby, data of A or C series, for example, (a0 (1), a0 (2), a0 (3)), (c0 (1), c0 (2), c0 (3)) are directly outputted from the branch metric calculation data obtaining unit 20, and data of B series, for example, (b0 (1), b0 (2), b0 (3)) are outputted as (0, 0, 0).

When B series is reduced, the right part of FIG. 8 illustrates the branch metric calculation data S2 obtained by the branch metric calculation data obtaining unit 20 from the digital multi-value data S1 illustrated in the left part of FIG. 8. As illustrated in FIG. 8, the branch metric calculation data S2 is such data that B series is reduced from the digital multi-value data S1, and the number of bits is decreased as compared to the digital multi-value data S1.

The branch metric calculation data obtaining unit 20 outputs the branch metric calculation data S2 to the decoding execution unit 90, and provides it for the calculation of the branch metric by the branch metric calculation unit 52.

The branch metric calculation unit 52 in the decoding execution unit 90 calculates the branch metric by using the branch metric calculation data S2 provided from the branch metric calculation data obtaining unit 20, and provides it to the ACS calculation unit 56. The ACS calculation unit 56 calculates the path metric and outputs it to the path metric holding unit 58 and the survival pass memory 64. The threshold decision normalization indication unit 54 indicates the path metric holding unit 58 to normalize, and responding to that, the path metric holding unit 58 normalizes and holds the path metric.

The maximum likelihood state decision unit 62, the trace back control unit 66, the survival pass memory 64, and LIFO 68 obtains the decoded data by using the path metric obtained by the ACS calculation unit 56, and the normalized path metric from the path metric holding unit 58.

In the exemplary embodiment, when the branch metric is calculated, the decoding execution unit 90 executes same operation as the conventionally known soft decision Viterbi decoding apparatus except that the branch metric calculation data S2 obtained by the branch metric calculation data obtaining unit 20 is used instead of the digital multi-value data S1, so that the detailed description will be omitted, and only the above summary will be described.

According to the Viterbi decoder 100 of the exemplary embodiment, when the soft decision Viterbi decoding is performed, if the quality of the received signal is not good, the digital multi-value data S1 expressing the amplitude of the received signal is directly used as the branch metric calculation data S2, on the other hand, if the quality of the received signal is good, the digital multi-value data S1 is reduced to decrease the number of bits, and then is used to calculate the branch metric. Thereby, if the quality of the received signal is good, that is, the high error correction capability is not required, the electric power consumption can be suppressed, and if the quality of the received signal is not good, that is, the high error correction capability is required, and the high error correction capability can be maintained.

And, in the Viterbi decoder 100 of the exemplary embodiment, because the soft decision Viterbi decoding is performed for the branch metric calculation data S2 regardless of the quality of the received signal, only the decoding execution unit 90 performing the soft decision Viterbi decoding may be installed, so that the implementation area can be small, and the electric power consumption can be suppressed.

And, in the Viterbi decoder 100 of the exemplary embodiment, in consideration of the relation between the standard deviation σ of the amplitude of the received signal and the quality of the received signal, the quality of the received signal is estimated by obtaining the standard deviation σ of the amplitude of the received signal, so that it is possible to appropriately estimate.

In the exemplary embodiment, if the standard deviation σ of the amplitude of the received signal is larger than the threshold, the digital multi-value data S1 is directly used to calculate the branch metric without reducing, on the other hand, if the standard deviation σ is no more than the threshold, one series of three series of the digital multi-value data S1 is reduced, then is used to calculate the branch metric. Here, the threshold will be considered, which is used to determine whether or not the digital multi-value data S1 should be reduced.

FIG. 9 illustrates BER (bit error rate: ratio of the number of bit errors and total number of transferred bits) characteristics in case that the convolution code of constraint length 7 and encoding rate 1/3 used for MB-OFDM is decoded without thinning-out, and the BER characteristics in case that it is decoded by reducing one series of the digital multi-value data S1 like the Viterbi decoder 100 of the exemplary embodiment. In FIG. 9, the horizontal axis is Eb/No, the vertical axis is BER. Meanwhile, the dotted line around BER=1.0 e-5 in FIG. 9 is the specifications of the BER characteristics defined by MB-OFDM.

Figure 10:
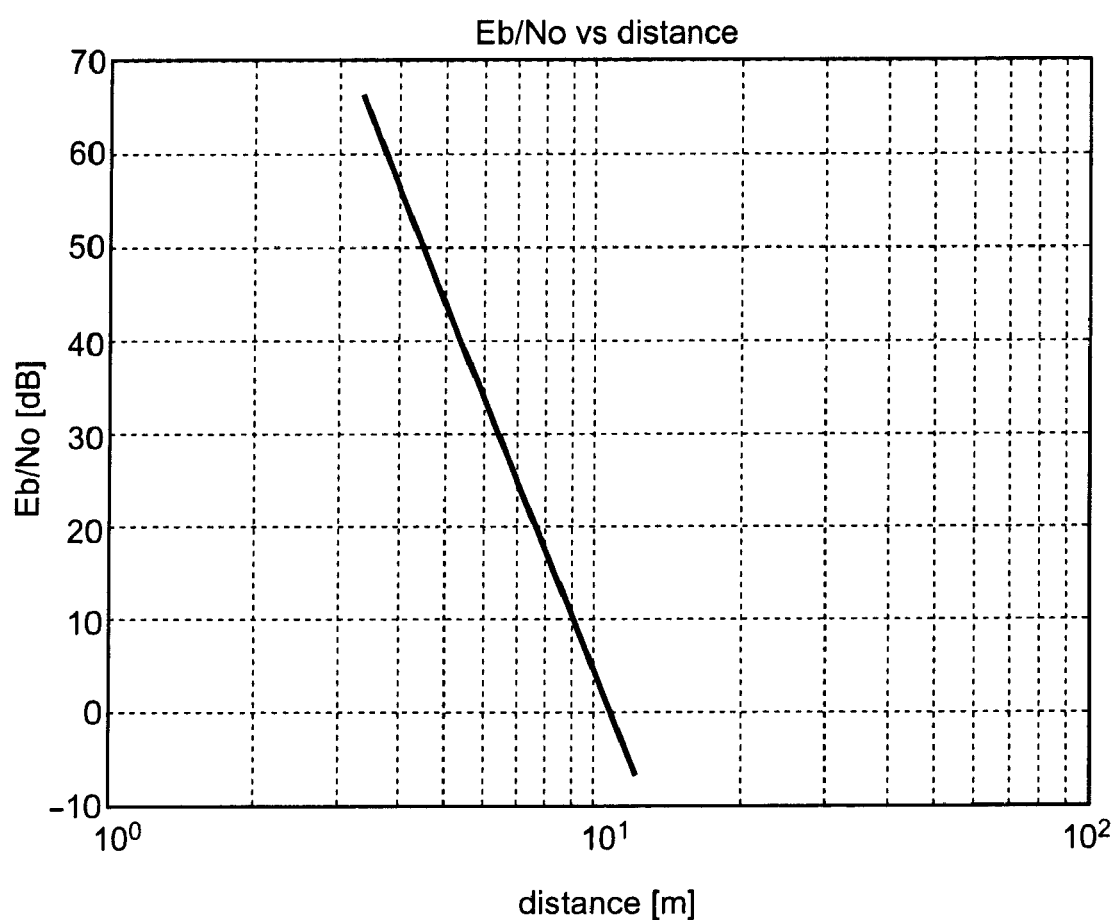
FIG. 10 is a diagram illustrating the relation between distance between a receiver and a transmitter, and Eb/No of received signal.

The quality of the received signal depends on distance between a transmitter and a receiver. FIG. 10 illustrates the relation between transmission distance and Eb/No of the received signal. As illustrated in FIG. 10, as the distance between a transmitter and a receiver is larger, Eb/No is smaller, that is, the quality of the received signal is lower. Meanwhile, according to the specification of MB-OFDM, 10 m of transmission distance is defined for 106.7 Mbps of transmission rate.

As illustrated in FIG. 9, Eb/No of the Viterbi decoder 100 of the exemplary embodiment is degraded by approximately 2 dB around BER=1.0 e-5 as compared with the Viterbi decoder without thinning-out. In consideration of the transmission rule based on the general square rule, in order not to depart from the specifications of the BER characteristics of MB-OFDM, the maximum transmission distance in case that the Viterbi decoder 100 is used is $10^{(-2/20)}$, that is, approximately 0.8 times as large as the maximum transmission distance of the Viterbi decoder without thinning-out. The Viterbi decoder 100 of the exemplary embodiment can suppress the electric power consumption without departing from the specifications of the BER characteristics of MB-OFDM if the transmission distance is no more than 8 m (5 m, even if margin is calculated on) for 106.7 Mbps of transmission rate.

Focusing on this point, for the Viterbi decoder 100 of the exemplary embodiment, it is preferable to set the threshold for determining whether or not the "thinning-out" is performed according to the distance with a receiver. Specifically, if it is out of the transmission distance (the above 8 m or such a distance that margin is calculated on) which does not depart from the BER characteristics of MB-OFDM even if the "thinning-out" processing is performed in case of the decoding, the threshold is set so that the control signal M which does not perform the "thinning-out" processing is always outputted from the control signal output unit 38, on the other hand, if it is within the transmission distance which does not depart from the BER characteristics of MB-OFDM even if the "thinning-out" processing is performed, the threshold is set so that the "thinning-out" processing is performed according to the quality of the received signal. Thereby, it is possible to suppress the electric power consumption while satisfying the BER characteristics required by the specifications.

In the Viterbi decoder 100 of the exemplary embodiment, because the number of bits is decreased by reducing the digital multi-value data S1 by series each, the processing for decreasing the number of bits can be realized with only the logical AND operation between the digital multi-value data S1 and the control signal M. Thus, the branch metric calculation data obtaining unit 20 can be configured with a small and simple circuit, and the electric power consumption for decreasing the number of bits of the digital multi-value data S1 can be suppressed.

Figures 18, 19:
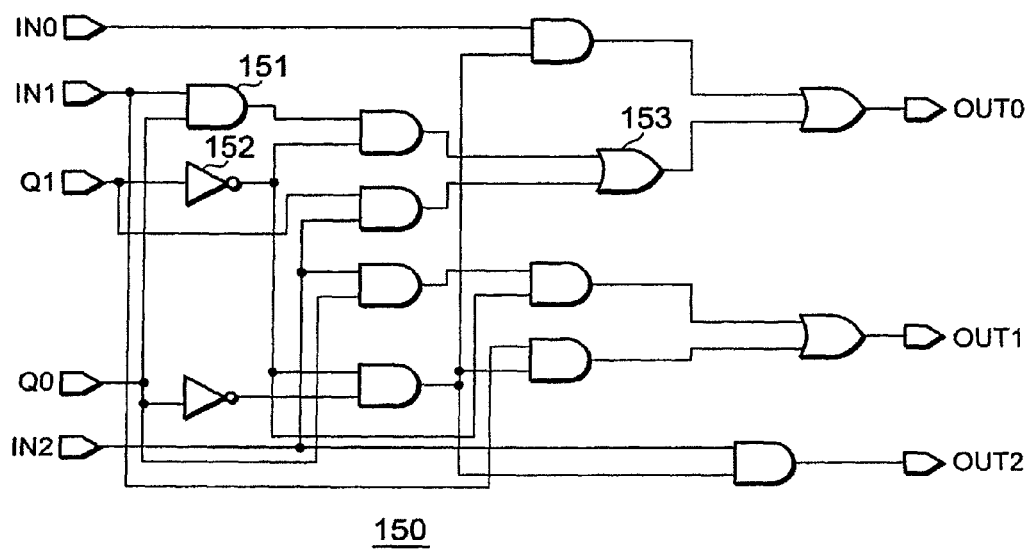
FIG. 18 is a diagram illustrating a configuration example of a circuit for realizing the processing of bit-shift by the conventional technology.
FIG. 19 is a diagram for describing an operation of the circuit illustrated in FIG. 18.

Here, the circuit for decreasing the number of bits of the digital multi-value data by the technology of the Patent Document 1 will be considered. The technology of the Patent Document 1 decreases the number of bits by bit-shifting for each series of the digital multi-value data. FIG. 18 illustrates a configuration example of a circuit which executes such bit-shifting for two series of the digital multi-value data. The shifter 150 illustrated in FIG. 18 bit-shifts a series of input data (INT 2, INT 1, INT 0) having three bits of width in bit, and realizes the function illustrated in FIG. 19. As illustrated in FIG. 19, if shift indicator (Q1, Q0) is (0, 0), the shifter 150 does not shift input data, and directly outputs it. On the other hand, if the shift indicator (Q1, Q0) is (0, 1), the input data (INT 2, INT 1, INT 0) is shifted downward by one bit to (o, INT 2, INT 1), and if the shift indicator (Q1, Q0) is (1, 1), the input data (INT 2, INT 1, INT 0) is shifted downward by two bits to (0, 0, INT 2).

As understood from FIG. 18, nine logical AND gates 151 and three logical OR gates 153 are necessary to realize such shift operation. On the other hand, because the branch metric calculation data obtaining unit 20 in the exemplary embodiment illustrated in FIG. 1 uses only three logical AND gates to decrease the number of bits of the digital multi-value data S1 of the same soft decision level, the electric power consumption for decreasing the number of bits is approximately 3/12 times as much as the shifter 150.

The above comparison is such an example that the number of bits of the soft decision level is three. If the number of bits of the soft decision level increases, the number of logical AND gates and logical OR gates further increases which are necessary for the shifter of the configuration as illustrated in FIG. 18, so that the difference of the electric power consumption from that of the branch metric calculation data obtaining unit of the configuration as illustrated in FIG. 6 is further larger.

In the exemplary embodiment, for example, the digital multi-value data S1 is inputted by three bits each, that is, by one series each to the branch metric calculation data obtaining unit 20, and the branch metric calculation data obtaining unit 20 is configured to include three logical AND gates. If data of the series to be reduced can be set to "0" with logical AND operation between data inputted to the branch metric calculation data obtaining unit 20 and the control signal M, such an aspect that the digital multi-value data S1 is inputted to the branch metric calculation data obtaining unit 20, and the number of logical AND gates provided in the branch metric calculation data obtaining unit 20 are not limited to this example.

Figures 11, 12:
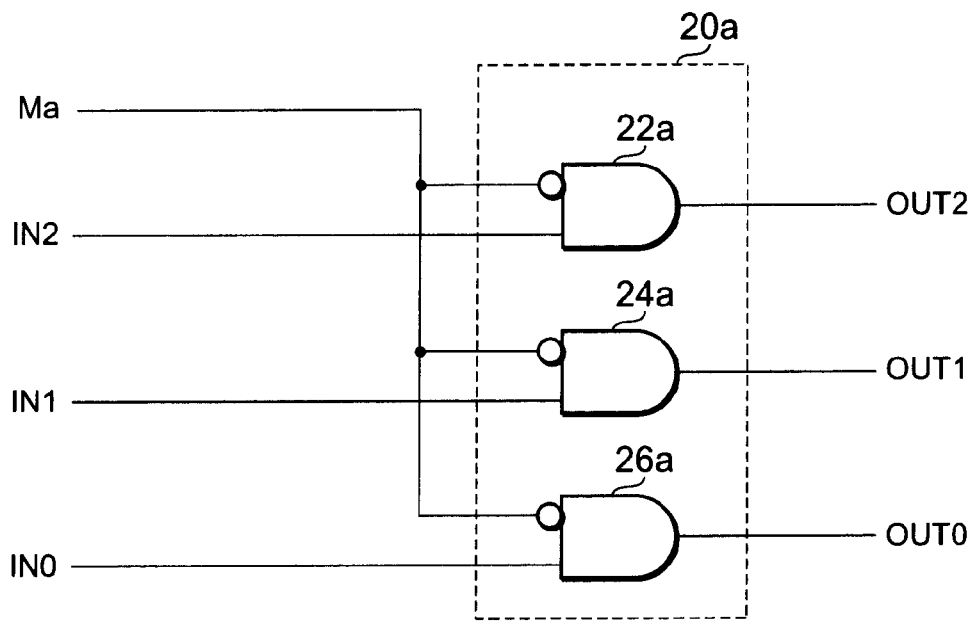
FIG. 11 is a block diagram illustrating a configuration of another branch metric calculation data obtaining unit which is applicable to the Viterbi decoder illustrated in FIG. 1.
FIG. 12 is a diagram for describing an operation of the branch metric calculation data obtaining unit illustrated in FIG. 11.

And, in the exemplary embodiment, while the mask signal is used which is 1 for the series to be reduced, and the control signal M is used for logical AND operation after inverting the value of the control signal M at each logical AND gate, if the series to be reduced can be set to "0" by logical AND operation between the control signal M and the digital multi-value data S1, and other series can be directly outputted, it is not necessarily limited to this configuration. For example, the branch metric calculation data obtaining unit 20A as illustrated in FIG. 11 may be used which includes logical AND gates 22A, 24A, and 26A which do not invert the control signal M. In this case, as illustrated in FIG. 12, if the control signal MA is used so as to be "0" for the series to be reduced, and "1" for other series than the series to be reduced, the function can be realized which is same as combination of the branch metric calculation data obtaining unit 20 and the control signal M illustrated in FIG. 6 and FIG. 7.

And, while the exemplary embodiment is such an example that one series is reduced for the digital multi-value data S1 having three series, the present invention can be applied to the digital multi-value data having other number of series than three, and the number of the series to be reduced is not limited to one series. For example, it is applied to the digital multi-value data having four series, and one series or two series may be reduced.

Further, in the exemplary embodiment, while the quality of the received signal is divided to only two stages of no lower than the prescribed level and lower than the prescribed level, the quality may be divided to more plural stages than two stages. In this case, as the level of the quality is higher, the number of the series to be reduced may be increased.

Figure 13:
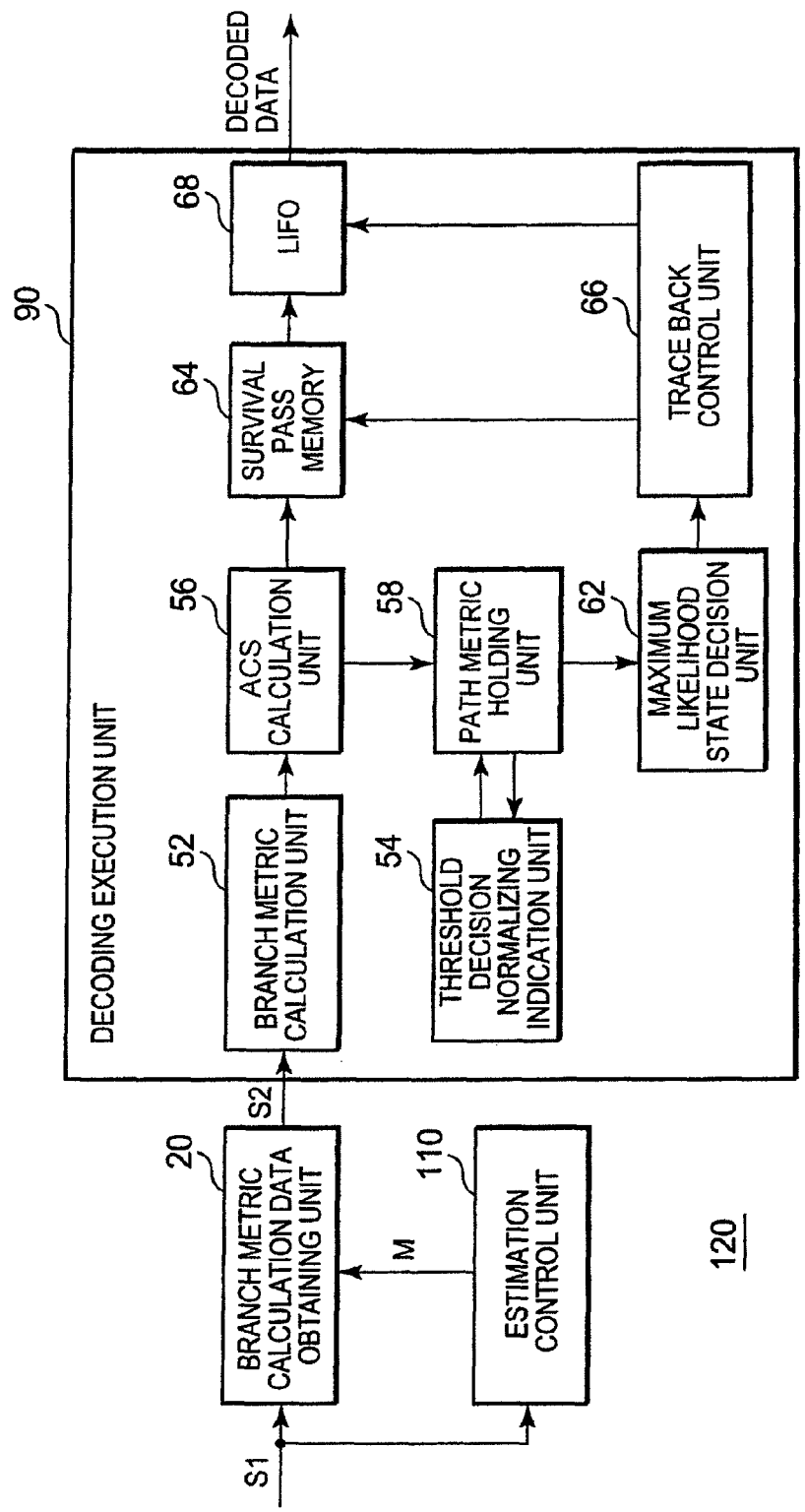
FIG. 13 is a block diagram illustrating a configuration of the Viterbi decoder according to another exemplary embodiment of the present invention.

FIG. 13 illustrates a Viterbi decoder 120 according to another exemplary embodiment of the present invention. Meanwhile, in the Viterbi decoder 120, the element having same function as that of the Viterbi decoder 100 is attached with same code, and its detailed description will be omitted.

The Viterbi decoder 120 is also the soft decision Viterbi decoder, and includes the branch metric calculation data obtaining unit 20 which obtains data for calculating the branch metric by using the digital multi-value data S1 expressing the amplitude of the received signal, an estimation control unit 110 which estimates the quality of the received signal by using the digital multi-value data S1, generates the control signal M based on the estimation result, and provides it to the branch metric calculation data obtaining unit 20, and the decoding execution unit 90 which decodes by using the branch metric calculation data S2 obtained by the branch metric calculation data obtaining unit 20, and obtains the decoded data. The decoding execution unit 90 includes a branch metric calculation unit 52, a threshold decision normalization indication unit 54, an ACS calculation unit 56, a path metric holding unit 58, a maximum likelihood state decision unit 62, a survival pass memory 64, a trace back control unit 66, and a Last In First Out Memory (LIFO) 68.

Figure 14:
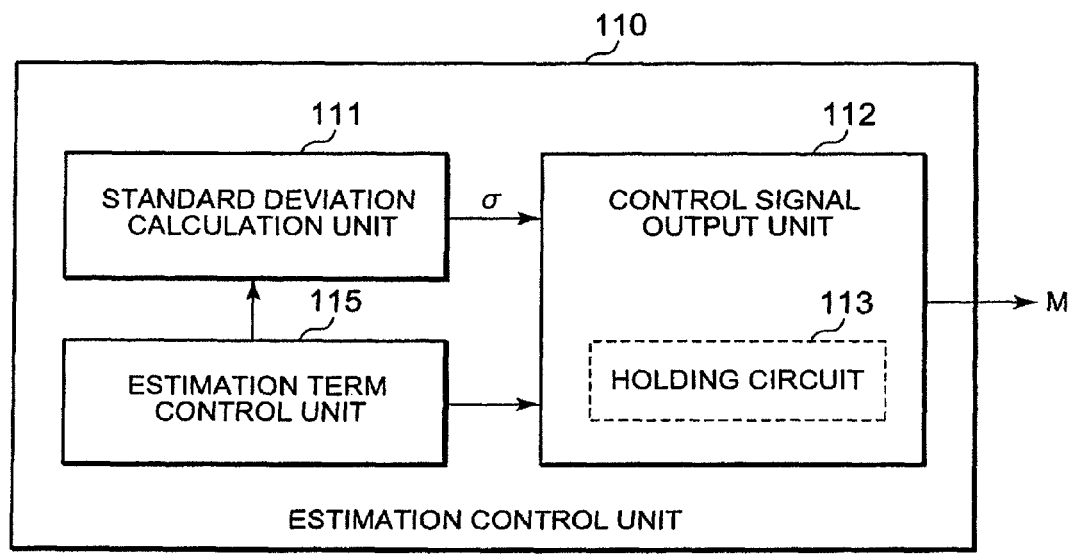
FIG. 14 is a block diagram illustrating a configuration of an estimation control unit of the Viterbi decoder illustrated in FIG. 13.
Figure 15:
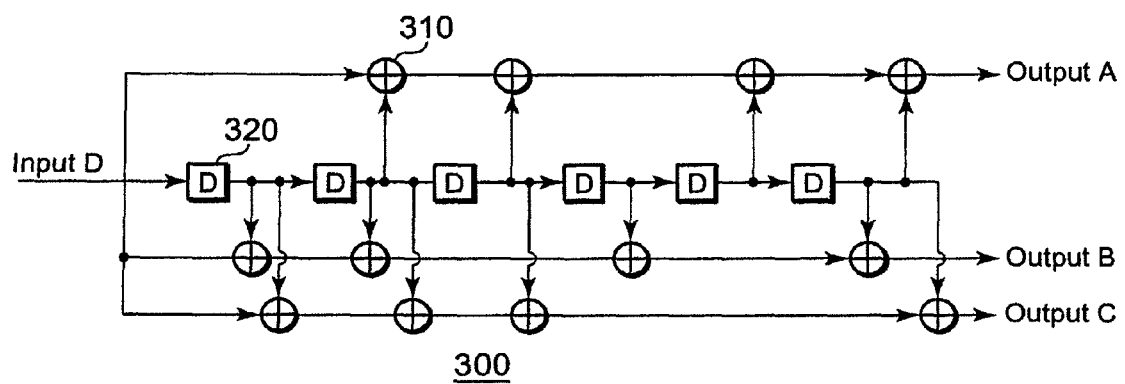
FIG. 15 is a block diagram illustrating an example of the convolution encoder.

FIG. 14 illustrates an estimation control unit 110. The estimation control unit 110 includes a standard deviation calculation unit 111, a control signal output unit 112, and an estimation term control unit 115. The control signal output unit 112 is provided with a holding circuit 113.

The estimation term control unit 115 causes the standard deviation calculation unit 111 to operate only in the estimation term, for example, a prescribed length term whose starting point is the time when the Viterbi decoding is started. This is realized, for example, by the time counter, not illustrated. The estimation term control unit 115 causes the standard deviation calculation unit 111 to stop the operation when the estimation term terminates, and outputs an indication causing the holding circuit 113 to operate to the control signal output unit 112.

The standard deviation calculation unit 111 calculates the standard deviation σ and outputs it to the control signal output unit 112 in the estimation term, and is caused to stop when the estimation term terminates.

The holding circuit 113 of the control signal output unit 112 holds the standard deviation σ which the standard deviation calculation unit 111 outputs just before the operation terminates according to the indication from the estimation term control unit 115.

The control signal output unit 112, in the estimation term, outputs the control signal M corresponding to the standard deviation σ outputted from the standard deviation calculation unit 111 to the decoding execution unit 90, and after the estimation term terminates, outputs the control signal M corresponding to the standard deviation σ held by the holding circuit 113 to the decoding execution unit 90.

The control signal M is same as the control signal outputted from the control signal output unit 38 in the Viterbi decoder 100.

The Viterbi decoder 120 of this exemplary embodiment can provide same effect as that of the Viterbi decoder 100 illustrated in FIG. 1, and further suppress the electric power consumed for the processing of decreasing the number of bits of the digital multi-value data S1.

Usually, the quality of the received signal is determined by the positional relation between a transmitter and a receiver, so that it is very rare that the channel conditions, that is, the quality of the received signal dramatically changes while communicating unless it is a mobile communication such as a portable telephone. The Viterbi decoder 120 of the exemplary embodiment is implemented focusing on this point, causes the standard deviation calculation unit 111 functioning as a quality estimation unit to operate only in a prescribed term from the time when the Viterbi decoding starts, then holds the quality estimation result of the received signal with the holding circuit 113, and outputs the control signal corresponding to the result. Thereby, it is possible to reduce the electric power consumption for the standard deviation calculation unit 111 after the estimation term.

The present invention has been described based on the above exemplary embodiments. The exemplary embodiments are just examples, so that various modifications and additions and reductions may be applied unless departing from concept of the present invention. It can be understand by those skilled in the art that the changed examples which such modifications and additions and subtractions are applied to are also in the scope of the present invention.

For example, in the above two exemplary embodiments, the standard deviation calculation unit 31 and the standard deviation calculation unit 111 functioning as a quality estimation unit outputs the standard deviation σ itself as the quality of the received signal, and the control signal output unit 38 and the control signal output unit 112 compare the standard deviation σ with the threshold. The quality estimation unit may be configured so as to provide a function which compares the standard deviation with the threshold and outputs the comparison result (the standard deviation is larger or smaller than the threshold) as quality in addition to a function calculating the standard deviation. In this case, the control signal output unit may generate and output control signal according to the comparison result from the quality estimation unit. Further, because the holding circuit in the Viterbi decoder 120 holds the comparison result instead of the standard deviation σ, it can be configured simpler.

And, while the Viterbi decoder of the above two exemplary embodiments estimate the quality based on the standard deviation σ of the amplitude of the received signal, another well-known quality estimation method such as a quality estimation method described in the Patent Document 1 may be used. In this case, because the number of bits is decreased with a simple circuit by reducing the digital multi-value data by series each, the electric power consumption can be suppressed as compared with the bit-shift method described in the Patent Document 1.

And, the Viterbi decoder of the above two exemplary embodiments decode the digital multi-value data in the soft decision Viterbi decoding, directly, or after reducing by series each, according to the quality of the received signal, estimates the quality of the received signal using the standard deviation σ of the amplitude of the received signal, and may selectively perform the decoding processes of methods whose amount of calculation is different according to the estimation result. For example, if the quality is good, the decoding may be performed by the decoding process whose error correction capability is not so high as compared with that of the soft decision Viterbi decoding, and whose amount of calculation is small like the hard decision Viterbi decoding, on the other hand, if the quality is not good, the decoding may be performed by the decoding process whose error correction capability is high like the soft decision Viterbi decoding. In this case, because the quality is estimated based on the standard deviation σ, the electric power consumption and the error correction capability can be correctly balanced with the appropriate estimation when the decoding is performed. Meanwhile, the kinds of such decoding processes selectively used are not limited to the Viterbi decoding, and the highness of the error correction capability and largeness of the amount of calculation are relative comparisons between such decoding processes.

It's possible to obtain the other rights having the following scopes.

Scope 15. A decoding method for a received signal having plural series of convolution codes, comprising:

calculating standard deviation of amplitude of the received signal;

estimating a quality of the received signal based on the standard deviation;

producing an indication in response to the quality; and executing decoding the received signal in response to the indication.

Scope 16. The decoding method according to Scope 15, wherein the plurality of decoding processes are a hard decision Viterbi decoding process and a soft decision Viterbi decoding process, the method further comprising:

decoding the received signal by using the soft decision viterbi process when the quality falls into a prescribed level.

Scope 17. The decoding method according to Scope 15, wherein the plurality of decoding processes are a first soft decision Viterbi decoding process which calculates branch metric and decodes the received signal, and a second soft decision Viterbi decoding process which calculates the branch metric and decodes the received signal after thinning out the received signal in unit of a series of convolution codes, the method further comprising:

decoding the received signal by using the second soft decision viterbi process when the quality rises to a prescribed level.

Scope 18. The decoding method according to any one of Scopes 16 to 17, further comprising:

setting a value of the prescribed level according to distance between a transmitter of convolution code and a receiver which executes the decoding.

It is apparent that the present invention is not limited to the above embodiments, but may be modified and changed without departing from the scope and spirit of the invention.

What is claimed is:

1. A soft decision Viterbi decoding apparatus for a received signal having plural series of convolution codes, the apparatus comprising:
   a quality estimation unit estimating a quality of the received signal to produce an estimated result;
   a control signal output unit outputting a thinning-out control signal only if the estimated result is above a prescribed level; and
   a branch metric calculation data obtaining unit generating calculation data for calculating branch metric in response to the received signal,
   wherein the calculation data is generated by a thinning-out operation performed on the received signal by which a number of bits in at least one of the plural series of convolution codes is decreased as compared to the received signal only if the thinning-out control signal is outputted.

2. The soft decision Viterbi decoding apparatus according to claim 1, wherein:
   the control signal output unit outputs a plurality of mask signals being included in the thinning-out control signal; and
   the branch metric calculation data obtaining unit performs a logical combination operation between the mask signal and the series of convolution codes.

3. The soft decision Viterbi decoding apparatus according to claim 1, wherein the quality estimation unit further comprises: a standard deviation calculation unit calculating standard deviation of amplitude of the received signal, and estimating the quality of the received signal based on the standard deviation.

4. The soft decision Viterbi decoding apparatus according to claim 1, further comprising:
   an estimation term control unit causing the quality estimation unit to operate only in a prescribed term; and
   a holding circuit holding the estimated result just before the quality estimation unit stops,
   wherein the control signal output unit outputs the thinning-out control signal based on the estimated result held by the holding circuit after the quality estimation unit stops.

5. The soft decision Viterbi decoding apparatus according to claim 1, wherein a value of the prescribed level is set according to distance from a transmitter of convolution code.

6. A decoding apparatus for a received signal having plural series of convolution codes, the apparatus comprising:
   a quality estimation unit calculating standard deviation of amplitude of the received signal, and estimating a quality of the received signal based on the standard deviation;
   a control signal output unit outputting control signals in response to the estimated quality; and
   a decoding execution unit executing decoding of the received signal in response to the control signals.

7. The decoding apparatus according to claim 6, wherein the decoding execution unit includes:
   a hard decision Viterbi decoding unit executing hard decision Viterbi decoding process; and
   a soft decision Viterbi decoding unit executing soft decision Viterbi decoding process,
   wherein the control signal output unit outputs a switchover control signal only if the quality falls below a prescribed level, and
   wherein said switchover control signal causes the decoding execution unit to switch over from the hard decision Viterbi decoding unit to the soft decision Viterbi decoding unit.

8. The decoding apparatus according to claim 6, wherein the decoding execution unit executes soft decision Viterbi decoding process,
   wherein the control signal output unit outputs a thinning-out control signal only if the estimated quality is above a prescribed level, and
   wherein said decoding apparatus further comprises: a branch metric calculation data obtaining unit generating calculation data for calculating branch metric in response to the received signal,
   wherein the calculation data is generated by a thinning-out operation performed on the received signal by which a number of bits in at least one unit of the plural series of convolution codes is decreased as compared to the received signal only if the thinning-out control signal is outputted.

9. The decoding apparatus according to any one of claims 6 to 8, further comprising:
   an estimation term control unit causing the quality estimation unit to operate only in a prescribed term; and
   a holding circuit holding an estimated result just before the quality estimation unit stops,
   wherein the control signal output unit outputs the control signals based on the estimated result held by the holding circuit after the quality estimation unit stops.

10. The decoding apparatus according to claim 9, wherein a value of the prescribed level is set according to a distance from a transmitter of the convolution code.

11. A soft decision Viterbi decoding method for a received signal having plural series of convolution codes, the method comprising:
    estimating the quality of the received signal;
    outputting a thinning-out control signal only if the estimated quality is above a prescribed level;
    generating calculation data only in response to the thinning-out control signal by a thinning-out the received signal by decreasing a number of bits in at least one of the plural series of convolution codes as compared to the received signal; and
    calculating branch metric based on the calculation data.

12. The soft decision Viterbi decoding method according to claim 11, further comprising:
    outputting a plurality of mask signals being included in the thinning-out control signal; and
    performing a logical combination operation between the mask signal and the series of convolution codes.

13. The soft decision Viterbi decoding method according to claim 11, further comprising:
    calculating standard deviation of amplitude of the received signal; and
    estimating the quality of the received signal based on the standard deviation.

14. The soft decision Viterbi decoding method according to claim 11, further comprising: setting a value of the prescribed level according to distance between a transmitter of convolution code and a receiver which executes the decoding.

* * * * *